US012244228B2

(12) United States Patent
Grande et al.

(10) Patent No.: US 12,244,228 B2
(45) Date of Patent: Mar. 4, 2025

(54) VOLTAGE REGULATOR DEVICE, CORRESPONDING METHOD AND DATA STORAGE SYSTEM

(71) Applicants: STMicroelectronics (Rousset) SAS, Rousset (FR); STMicroelectronics S.r.l., Agrate Brianza (IT)

(72) Inventors: Francesca Grande, Syracuse (IT); Francesco La Rosa, Rousset (FR); Maria Giaquinta, Catania (IT); Alfredo Signorello, Tremestieri Etneo Catania (IT)

(73) Assignees: STMicroelectronics (Rousset) SAS, Rousset (FR); STMicroelectronics S.r.l., Agrate Brianza (IT)

( * ) Notice: Subject to any disclaimer, the term of this patent is extended or adjusted under 35 U.S.C. 154(b) by 166 days.

(21) Appl. No.: 18/187,831

(22) Filed: Mar. 22, 2023

(65) Prior Publication Data
US 2023/0318450 A1    Oct. 5, 2023

(30) Foreign Application Priority Data
Apr. 1, 2022 (IT) .......................... 102022000006488

(51) Int. Cl.
| H02M 3/07 | (2006.01) |
| G11C 16/30 | (2006.01) |
| H02M 1/08 | (2006.01) |
| G11C 16/10 | (2006.01) |

(52) U.S. Cl.
CPC ............ *H02M 3/077* (2021.05); *G11C 16/30* (2013.01); *H02M 1/08* (2013.01); *G11C 16/10* (2013.01)

(58) Field of Classification Search
CPC .......... H02M 3/077; H02M 1/08; H02M 3/07; G11C 16/30; G11C 16/10; G11C 5/145
USPC ...................................................... 365/185.18
See application file for complete search history.

(56) References Cited

U.S. PATENT DOCUMENTS

| 6,980,045 | B1 | 12/2005 | Liu |
| 8,896,367 | B1 * | 11/2014 | Lin ....................... H02M 3/073 363/60 |
| 10,038,372 | B2 | 7/2018 | La Rosa et al. |
| 2011/0221514 | A1 | 9/2011 | Pan |
| 2014/0022005 | A1 * | 1/2014 | Ramanan ................ H02M 3/07 327/536 |
| 2020/0111513 | A1 * | 4/2020 | Baek .................... G11C 11/5671 |
| 2021/0036604 | A1 * | 2/2021 | Khlat ...................... H02M 3/07 |
| 2022/0166319 | A1 * | 5/2022 | Brambilla ........... H02M 1/0845 |
| 2023/0128793 | A1 * | 4/2023 | Chen ..................... H02M 3/158 363/69 |

(Continued)

*Primary Examiner* — Fernando Hidalgo
(74) *Attorney, Agent, or Firm* — Slater Matsil, LLP

(57) ABSTRACT

In an embodiment a device includes a supply node configured to receive a supply voltage, an output node configured to provide an output voltage, a plurality of switching stages coupled to the supply node and to the output node, a sensing circuit coupled to the supply node and configured to provide at least one sensing signal based on the supply voltage and a driver circuit coupled to the sensing circuit and to the plurality of switching stages, wherein the driver circuit is configured to provide the drive signal based on at least one sensing signal exceeding or failing to exceed at least one reference voltage level and to selectively bypass a selected number of the plurality of switching stages based on the drive signal thereby varying an output voltage level at the output node.

19 Claims, 7 Drawing Sheets

(56) References Cited

U.S. PATENT DOCUMENTS

2023/0268829 A1\* 8/2023 Sugie .................. H02M 1/08
                                                          327/536

\* cited by examiner

VOLTAGE REGULATOR DEVICE, CORRESPONDING METHOD AND DATA STORAGE SYSTEM

CROSS-REFERENCE TO RELATED APPLICATIONS

This application claims the benefit of Italian Application No. 102022000006488, filed on Apr. 1, 2022, which application is hereby incorporated herein by reference.

TECHNICAL FIELD

The description relates to voltage regulator devices. One or more embodiments may be applied to charge pump devices, for instance. One or more embodiments may be applied to data storage systems, e.g., to produce high operating voltages to program flash memory cells configured to store data.

BACKGROUND

Charge pump circuits are a kind of voltage regulator (or DC-to-DC converter) configured to receive a DC supply voltage and comprising capacitors as energy-storage elements to provide an output DC voltage either higher or lower than the input DC supply voltage.

Charge pump circuits are known, for instance, from U.S. Pat. No. 10,038,372.

In some cases, the supply voltage can vary between a low value (for example, about 1.55 V) and a high value (for example, about 3.6 V).

The voltage regulator can be coupled to a varying load to provide the output DC voltage to, so that also intensity of the current flowing in the load can vary. Depending on the kind of load, a ripple of the output DC voltage may have limited acceptance ranges.

A closed-loop control system may be coupled to the charge pump to regulate the output voltage provided thereby.

Charge pump circuit design may involve sizing number of capacitors, respective capacitances and clock frequency for the worst-case scenario in which, for instance:

the input supply voltage is at a minimum value,
the current in the load is expected to be at a maximum intensity,
a ripple of the output voltage reaches a maximum tolerance limit,
temperature values are at worst-case corner levels.

In order to match performances in these worst-case conditions (for example, at low supply voltage), charge pump circuit parameters may be over-sized.

As a result, the charge pump device may present an oversized footprint, leading to overconsumption of power in operative scenarios different than the worst-case one.

Also, existing solutions present one or more of the following drawbacks:

non-negligible current consumption involved in control with respect to the current consumed by the pump when working in low power-mode,
difficulty in providing a system capable of fast reaction in response to a high drive capability level demand,
difficulty in providing compatibility between a slope/variation speed of the supply voltage and continuity of closed-loop control.

SUMMARY

Embodiments provide reduced power consumption in operative conditions of a charge pump circuit.

Embodiments may relate to a flash memory system and a related method.

One or more embodiments provide a way to adapt parameters of charge pumps to operating conditions (e.g., supply level, requested current, ripple).

For instance, a solution as exemplified herein facilitates reducing power consumption in voltage regulators, such as charge pumps.

One or more embodiments facilitate aligning power consumption in regulator (or converter) devices to application-specific performance demands thereof.

For instance, one or more embodiments facilitate adapting converter performance to the supply voltage level via varying a number of (e.g., charge pump) stages based on sensing signals sensed at charge pump stages exceeding or failing to exceed user-selectable threshold levels.

One or more embodiments advantageously exploit hysteresis comparator to filter the noise on the supply voltage.

For instance, using a hysteresis comparator can facilitate energy saving by also countering the risk of continuous switching when the supply voltage has a value about the same of the comparator threshold value.

BRIEF DESCRIPTION OF THE DRAWINGS

One or more embodiments will now be described, by way of non-limiting example only, with reference to the annexed Figures, wherein.

Corresponding numerals and symbols in the different figures generally refer to corresponding parts unless otherwise indicated.

The figures are drawn to clearly illustrate the relevant aspects of the embodiments and are not necessarily drawn to scale.

The edges of features drawn in the figures do not necessarily indicate the termination of the extent of the feature.

DETAILED DESCRIPTION OF ILLUSTRATIVE EMBODIMENTS

In the ensuing description, one or more specific details are illustrated, aimed at providing an in-depth understanding of examples of embodiments of this description. The embodiments may be obtained without one or more of the specific details, or with other methods, components, materials, etc. In other cases, known structures, materials, or operations are not illustrated or described in detail so that certain aspects of embodiments will not be obscured.

Reference to "an embodiment" or "one embodiment" in the framework of the present description is intended to indicate that a particular configuration, structure, or characteristic described in relation to the embodiment is comprised in at least one embodiment. Hence, phrases such as "in an embodiment" or "in one embodiment" that may be present in one or more points of the present description do not necessarily refer to one and the same embodiment.

Moreover, particular conformations, structures, or characteristics may be combined in any adequate way in one or more embodiments.

The drawings are in simplified form and are not to precise scale.

Throughout the figures annexed herein, like parts or elements are indicated with like references/numerals unless the context indicates otherwise, and for brevity a corresponding description will not be repeated for each and every figure.

The references used herein are provided merely for convenience and hence do not define the extent of protection or the scope of the embodiments.

For the sake of simplicity, in the following detailed description a same reference symbol may be used to designate both a node/line in a circuit and a signal which may occur at that node or line.

Voltage regulator or DC-DC converter devices, such as charge pumps, for instance, can have a variety of circuit arrangements or topologies.

Figure 1:
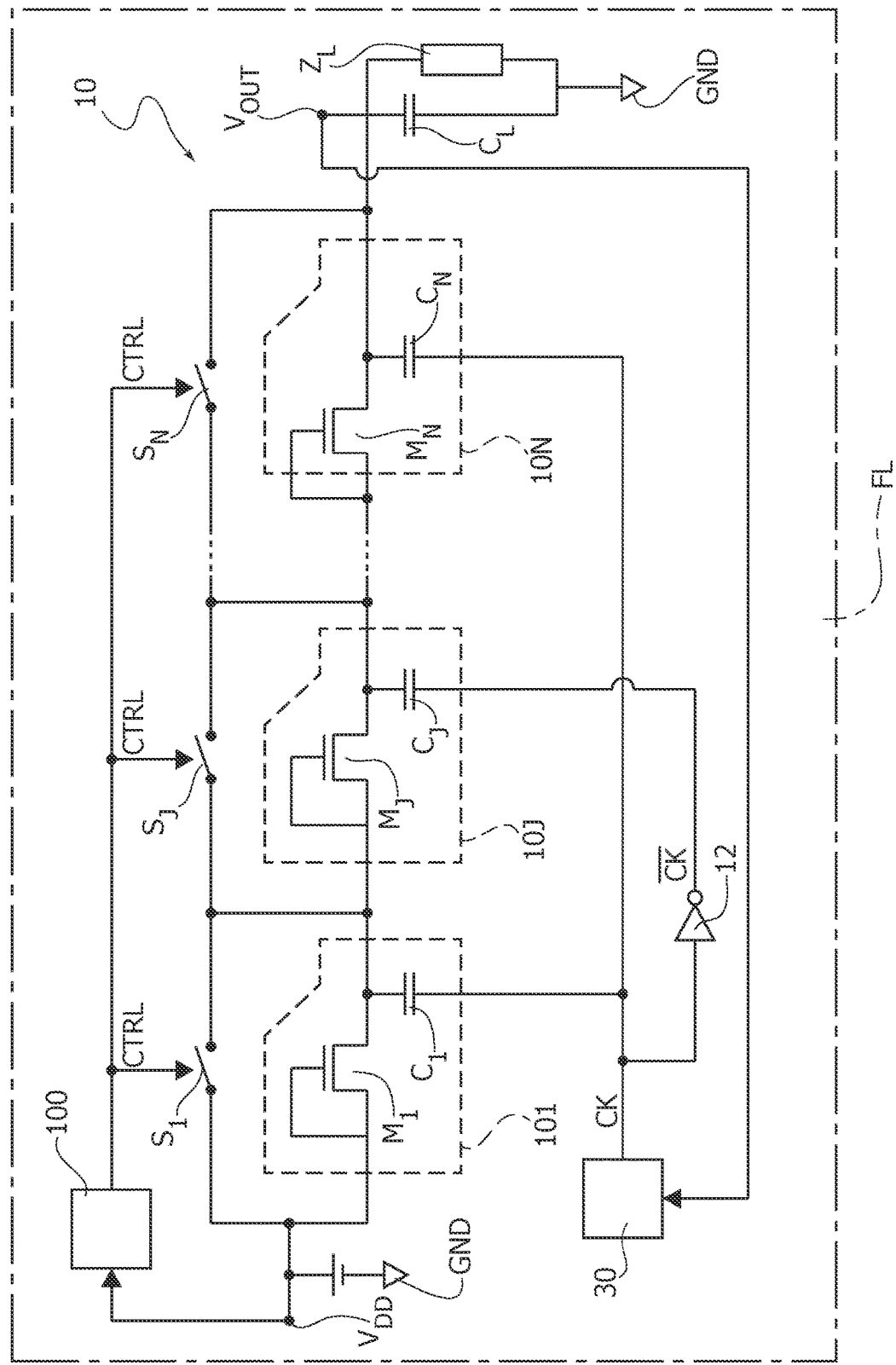
FIGS. 1-2 are diagrams exemplary of charge pump circuits according to the present disclosure.

As exemplified in FIG. 1, a flash memory systems FL comprises a device 10 comprising a (e.g., Dickson-type) charge pump circuit coupled to a respective pump regulator (or voltage regulator) 30.

Figure 2:
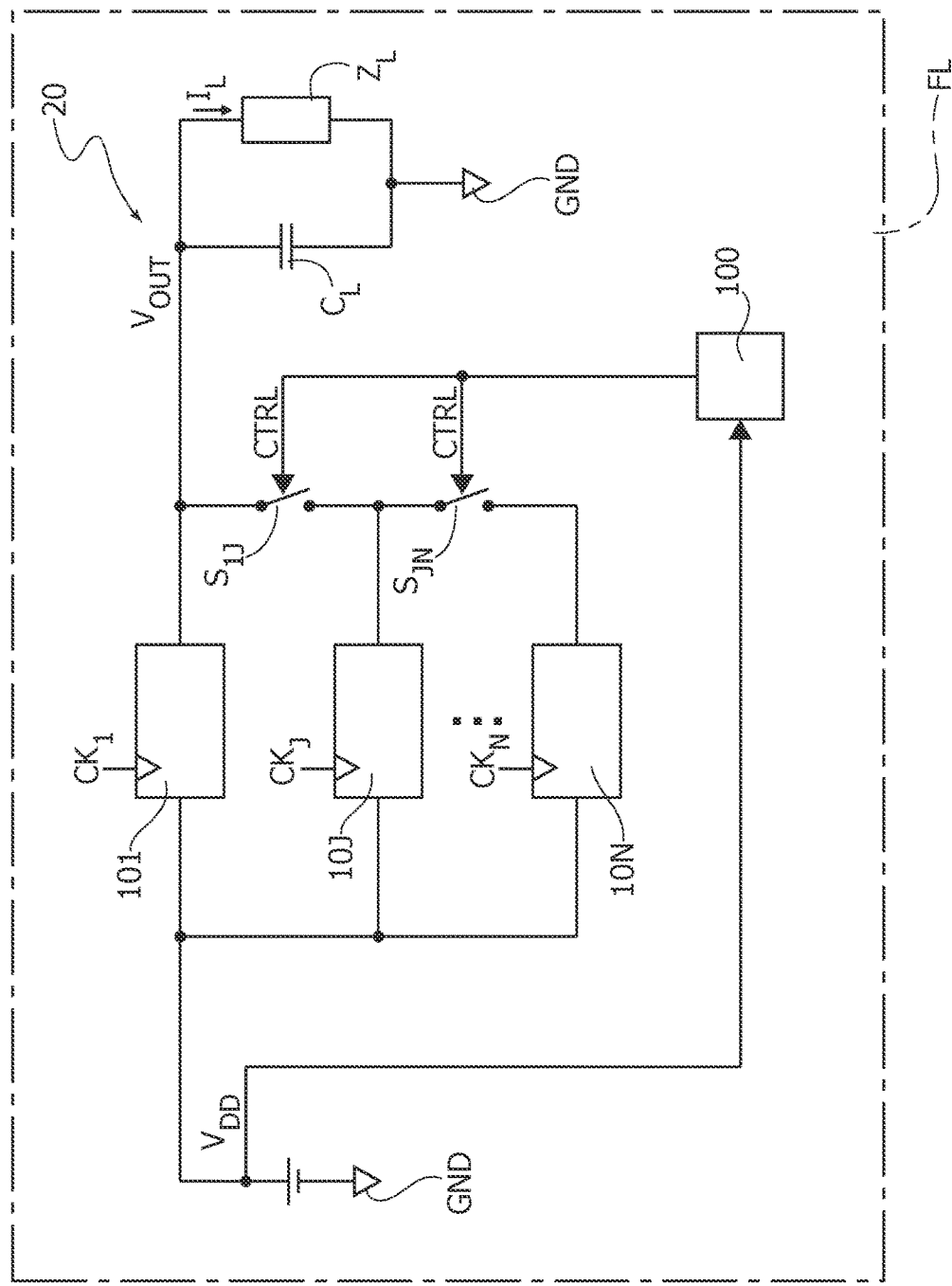

As exemplified herein, a data storage system FL comprises:
  a supply voltage source VDD configured to provide a supply voltage level VDD referred to ground GND,
  a set of devices 10, 20 as exemplified in FIGS. 1 and 2, the set of devices configured to provide a respective set of output voltages $V_{OUT}$ at a set of output nodes $V_{OUT}$ based on said supply voltage level VDD,
  a set of data storage cells $C_L$, $Z_L$ coupled to the set of devices to receive therefrom the set of output voltages provided at the respective set of output nodes.

For instance, data storage cells in said set of data storage cells are configured to be programmed to store data via the set of received output voltages.

As exemplified in FIG. 1, the device 10 comprises:
  a supply node VDD configured to be coupled to a power supply source to receive a supply voltage VDD therefrom,
  a plurality of charge pump stages 101, 10J, 10N comprising charge pump stages coupled therebetween, e.g., in a cascaded arrangement, the plurality of charge pump stages 101, 10J, 10N coupled to the supply node VDD to receive the supply voltage VDD therefrom and to provide an output voltage $V_{OUT}$ at a respective output node $V_{OUT}$ based on the supply voltage VDD,
  a load impedance $C_L$, $Z_L$ (such as a cell of the flash memory FL, for instance) coupled to the output node $V_{OUT}$ to receive the output voltage $V_{OUT}$ therefrom, the load impedance $C_L$, $Z_L$ comprising a reactive component (e.g., a capacitance) $C_L$ and a load resistance $Z_L$, wherein a load current $I_L$ flows into the load resistance $Z_L$ as a result of applying the output voltage $V_{OUT}$ to the load impedance $C_L$, $Z_L$.

As exemplified in FIG. 1, charge pump stages in the plurality of charge pump stages 101, 10J, 10N comprise a capacitive branch $C_1$, $C_j$, $C_N$ and a switching transistor $M_1$, $M_j$, $M_N$, wherein a j-th switching transistor (e.g., $M_j$) in a j-th charge pump stage (e.g., 10J) has a control node configured to receive (e.g., via the j-th capacitive branch $C_j$) a (digital or binary) clock signal CK, the j-th switching transistor (e.g., $M_j$) having a current path therethrough between the j-th capacitive branch (e.g., $C_j$) of the j-th charge pump stage (e.g., 10J) and the (j+1)-th capacitive branch (e.g., $C_N$) of the (j+1)-th charge pump stage (e.g., 10N) configured to be made conductive, resp. non-conductive, in response to the clock signal CK received at its control node having a first (e.g., "1" or "high"), respectively second (e.g., "0" or "low"), logic value.

For instance, the plurality of switching transistors $M_1$, $M_j$, $M_N$ in the plurality of charge pump stages 101, 10J, 10N may follow an "interleaved" pattern (per se known) in which a j-th switching transistor (e.g., $M_j$) receives the control signal CK while the adjacent switching transistors (e.g., $M_1$ and $M_N$) indexed (i−1) and (i+1) receive a negated or anti-phase version $\overline{CK}$ of the control signal CK (e.g., produced via and inverter circuit 12, as exemplified in FIG. 1).

As exemplified in FIG. 1, the plurality of switched stages 101, 10J, 10N comprises: a first subset of switched stages 101, 10N comprising respective switching transistors $M_1$, $M_N$ having respective control nodes coupled to a first clock node CK to receive a first clock signal CK therefrom, the respective switching transistors in the first subset of switched stages being configured to have respective current flow paths therethrough made conductive and non-conductive based on a first clock signal CK received at respective control nodes having a first or second logic value; a second subset of switched stages 10J comprising respective switching transistors $M_j$ having respective control nodes coupled to a second clock node 12 to receive a second clock signal $\overline{CK}$ therefrom, the respective switching transistors in the second subset of switched stages being configured to have respective current flow paths therethrough made conductive and non-conductive based on the second clock signal $\overline{CK}$ received at respective control nodes having a first or second logic value. For instance, the second clock signal is in antiphase with the first clock signal.

In an exemplary scenario, a maximum output voltage level that may be provided by a charge pump circuit can be expressed as:

$$V_{OUT_{max}} = (N+1)VDD$$

where VDD is the supply voltage level and N is the number of charge pump stages 101, 10J, 10N.

Still in the considered exemplary scenario, intensity of the output current IL flowing in the load resistance $Z_L$ can be expressed as:

$$I_L = \frac{fc}{N}[(N+1)VDD - V_{OUT}]$$

where fc is a frequency of the clock signal CK.

Still in the considered exemplary scenario, a relationship between electric current IDD dissipated in the power supply VDD and the output current $I_L$ provided to the load $Z_L$ may be expressed as:

$$IDD = \eta I_L$$

where η is the inefficiency factor and is proportional to number N of charge pump stages 101, 10J, 10N.

In various exemplary scenarios, the supply voltage level VDD received can be varying in a wide range of values. For instance, with respect to a setpoint value of the regulated output voltage level $V_{OUT}$, there may be cases in which the supply voltage level VDD varies appreciably below and/or above the setpoint value of output voltage level $V_{OUT}$.

One or more embodiments provide a way of adjusting the number N of stages/modules 101, 10J, 10N used in a device 10 based on the input supply voltage level VDD.

For instance, in an application scenario the number N of charge pump stages 101, 10J, 10N is selected so as to reduce (e.g., to the minimum) the current IDD dissipated in the supply generator VDD.

As exemplified in FIG. 1, the charge pump circuit preferably comprises a plurality of switches $S_1$, $S_j$, $S_N$ (e.g., in an amount equal to the number N of stages 101, 10J, 10N) configured to receive (e.g., from a control logic circuit block 100) at least one control signal CTRL, the plurality of switches $S_1$, $S_j$, $S_N$ being coupled to the plurality of charge pump circuit stages (or modules) 101, 10J, 10N.

For instance, a j-th switch (e.g., $S_j$) is interposed between the adjacent stages (e.g., 101, 10N) indexed (j−1) and (j+1) in parallel with the respective j-th switching transistor (e.g., $M_j$), the j-th switch (e.g., $S_j$) configured to be closed or conductive when in a first (e.g., "ON") state and to be open or non-conductive when in a second (e.g., "OFF") state in response to the at least one control signal CTRL having a first or second value, respectively.

In one or more embodiments the control signal CTRL may be a 1-bit or a multi-bit digital signal.

For the sake of simplicity, principles underlying embodiments are discussed in the following mainly with reference to a 1-bit control signal CTRL, being otherwise understood that such a number of bits is purely exemplary and in no-way limiting.

For instance:
  when the control signal CTRL is asserted with a first (e.g., "1" or "high") value, the j-th switch (e.g., $S_j$) is closed so as to short-circuit the j-th charge-pump circuit stage (e.g., 10J), thereby de-activating this stage 10J and varying (e.g., from N to N−1) the number of active charge pump stages 101, 10N in the charge pump circuit 10, and
  when the control signal CTRL is asserted with a second (e.g., "0" or "low") value, the j-th switch (e.g., $S_j$) is turned off so as to re-activate the j-th charge-pump circuit stage (e.g., 10J), thereby increasing (e.g., from N−1 to N) and restoring the number of active charge pump stages 101, 10J, 10N in the charge pump circuit 10.

As exemplified herein, at least one bit of the control signal CTRL may be asserted with the first (e.g., "1" or "high") or second (e.g., "0" or "low") logic value based on the supply voltage level VDD exceeding or failing to exceed a certain threshold, as discussed in the following.

As exemplified in FIG. 1, switched stages in the plurality of switched stages 101, 10J, 10N are arranged with current flow paths therethrough cascaded in a current flow line between said supply node VDD and the output node $V_{OUT}$ of the device 10.

One or more embodiments are discussed in the following mainly with respect the arrangement of switches $S_1$, $S_j$, $S_N$ or $S_{jN}$ exemplified in FIG. 1 or 2 being used to selectively bypass charge pump stages/modules. It is noted that these arrangements are purely exemplary and in no way limiting.

One or more embodiments may be exempt from such an arrangement of switches. For instance, in alternative scenarios the drive signal CTRL may directly be provided to the charge pump stages 101, 10J, 10N for selective bypassing respective charge pump module in the plurality of charge pump modules 101, 10J, 10N (e.g., using the control signal CTRL as an enable signal switching ON/OFF the switchable charge pump stages or modules 101, 10J, 10N).

As exemplified in FIG. 2, the plurality of charge pump stages (or modules) 101, 10i, 10N may be arranged to form an alternative charge pump circuit topology 20 in which a plurality of charge pump modules 101, 10J, 10N are coupled therebetween, e.g., stacked in parallel between the supply node VDD and the output node $V_{OUT}$, providing a bundle of current flow lines between the supply node VDD and the output node $V_{OUT}$.

As exemplified in FIG. 1, switched stages in the plurality of switched stages 101, 10J, 10N are arranged with current flow paths therethrough providing respective current flow lines between the supply node VDD and the output node $V_{OUT}$ of the device 20.

In the alternative scenario exemplified in FIG. 2, the device 20 preferably comprises a plurality of switches $S_{1j}$, $S_{jN}$ (e.g., in an amount decreased by one with respect to the number N of stages 101, 10J, 10N) configured to receive the at least one control signal CTRL, the plurality of switches $S_{1j}$, $S_{jN}$ interposed between the plurality of charge pump circuit modules 101, 10J, 10N, wherein a j-th switch (e.g., $S_{1j}$ in the plurality of switches $S_{1j}$ is configured to be alternatively closed or conductive when in a first (e.g., "ON") state and open or non-conductive when in a second (e.g., "OFF") state in response to the (e.g., 1-bit) control signal CTRL having a first (e.g., "1" or "high") or second (e.g., "0" or "low") logic value, respectively.

For instance, the plurality of charge pump circuit modules 101, 10J, 10N of the charge pump circuit 20 exemplified in FIG. 2 are operated via respective clock signals $CK_1$, $CK_j$, $CK_N$ (e.g., having respective clock phases) and work in parallel to (each) provide a respective portion of the load current $I_L$.

Still in the considered example, the configuration 20 reduces the ripple on the output voltage $V_{OUT}$, which is a function of the power supply level VDD, by varying the number of operating charge pump stages 101, 10J, 10N, for instance:
  varying, e.g., decreasing the number of coupled stages in response to an increase in VDD, and/or
  varying, e.g., decreasing the clock frequency (or increasing the clock period) of clock signals $CK_1$, $CK_j$, $CK_N$, as discussed in the following mainly with relation to FIGS. 7 to 12.

As exemplified herein, at least one bit of the control signal CTRL may be asserted with the first or second logic value based on the supply voltage level VDD being above or below a certain threshold, as discussed in the following.

As exemplified in FIGS. 1 and 2, reducing power dissipation may be advantageous in the context of flash memory systems FL where the voltage regulator 10 may be used to program load data cells $C_L$ of the memory system FL.

For the sake of simplicity, principles underlying the solution as exemplified herein are mainly discussed with reference to a device 10, 20 comprising three stages 101, 10J, 10N being otherwise understood that such a number of stages/modules 101, 10J, 10N is purely exemplary and in no way limiting as notionally any number greater than two charge pump stages/modules 101, 10J, 10N may be employed. As exemplified in FIGS. 1 and 3, the clock signal CK of the devices 10, 20 is produced via a clock generator (or pump regulator) circuit block 30.

In one or more embodiments, a circuit as discussed in document U.S. Pat. No. 10,038,372 B2 may be suitable for use as clock generator circuit block 30 to produce the clock signal CK for the charge pump circuits 10, 20.

Figure 3:
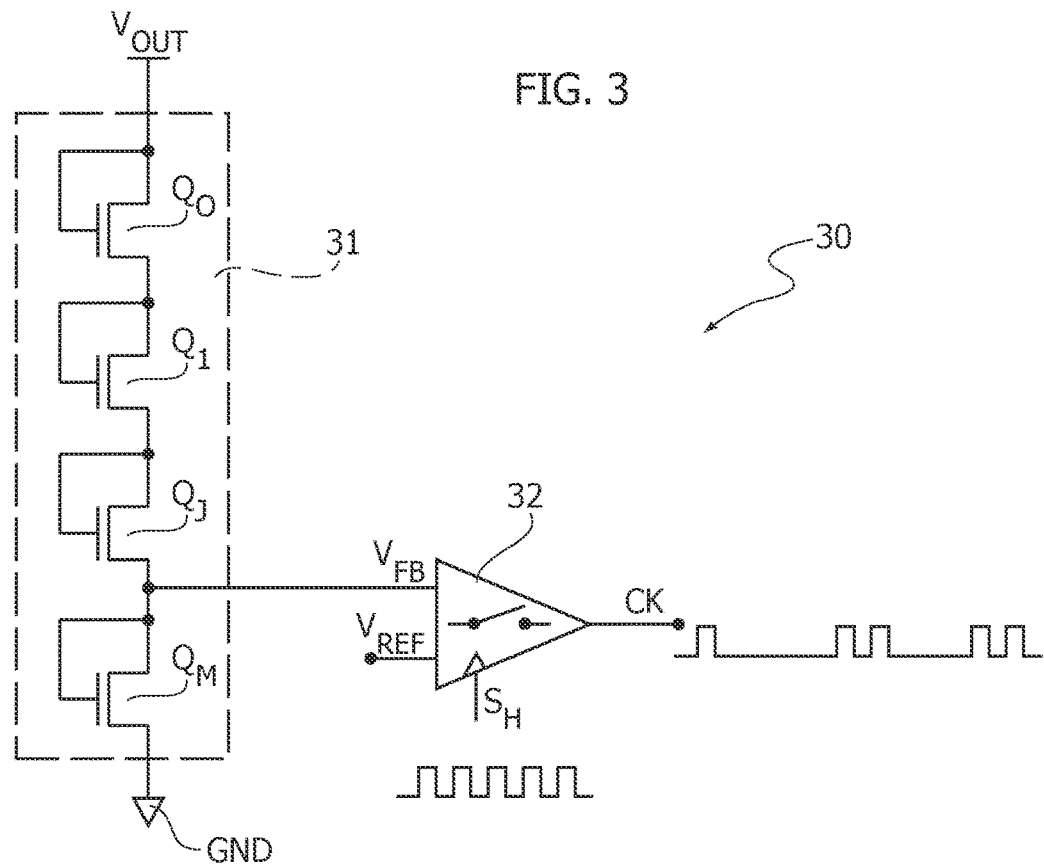
FIG. 3 is a diagram exemplary of a clock generator in charge pump circuits.

As exemplified in FIG. 3, the clock generator circuit block 30 comprises:
- a potential divider 31 (e.g., comprising a cascade of transistors $Q_0$, $Q_1$, $Q_j$, $Q_M$) coupled to the output node VOUT of the charge pump 10, 20, to receive the output voltage $V_{OUT}$ therefrom and to provide a feedback voltage $V_{FB}$ proportional to the output voltage $V_{OUT}$, and
- a dynamic comparator 32 (known per se) comprising a first input node $V_{FB}$ coupled to the potential divider 31, e.g., coupled to the last M-th switching transistor $Q_M$ thereof, and configured to receive the feedback signal $V_{FB}$ proportional to the output voltage $V_{OUT}$ of the charge pump circuit 10.
- a second input node $V_{REF}$ configured to receive a reference signal $V_{REF}$, e.g., a reference voltage level $V_{REF}$ selected by the user or provided in a manner per se known,
  - a synchronization node $S_H$ configured to receive a synchronization signal $S_H$, the comparator 32 being a dynamic comparator configured to output the result of the comparison at a (e.g., rising or falling) edge of the synchronization signal $S_L$.

As exemplified in FIG. 3, the comparator 32 is configured to perform a comparison between the sensing signal $V_{FB}$ and the reference signal $V_{REF}$ and to produce the clock signal CK as a result of the comparison, providing a (e.g., Boolean) digital output whose logic value is based on whether a difference between signals $V_{FB}$, $V_{REF}$ input to the comparator 32 is positive or negative.

For instance, the clock signal CK has a first (binary) value (e.g., "1") in response to the feedback signal $V_{FB}$ exceeding the reference signal $V_{REF}$ and a second (binary) value (e.g., "0") in response to the feedback signal $V_{FB}$ failing to exceed the reference signal $V_{REF}$.

As exemplified in FIG. 3, the comparator 32 performs the comparison only during a time interval in which the synchronization signal $S_H$ is asserted with a first logic value (e.g., "high") so that current consumption of the comparator 32 is reduced with respect to comparators operating in a continuous manner.

Figure 4:
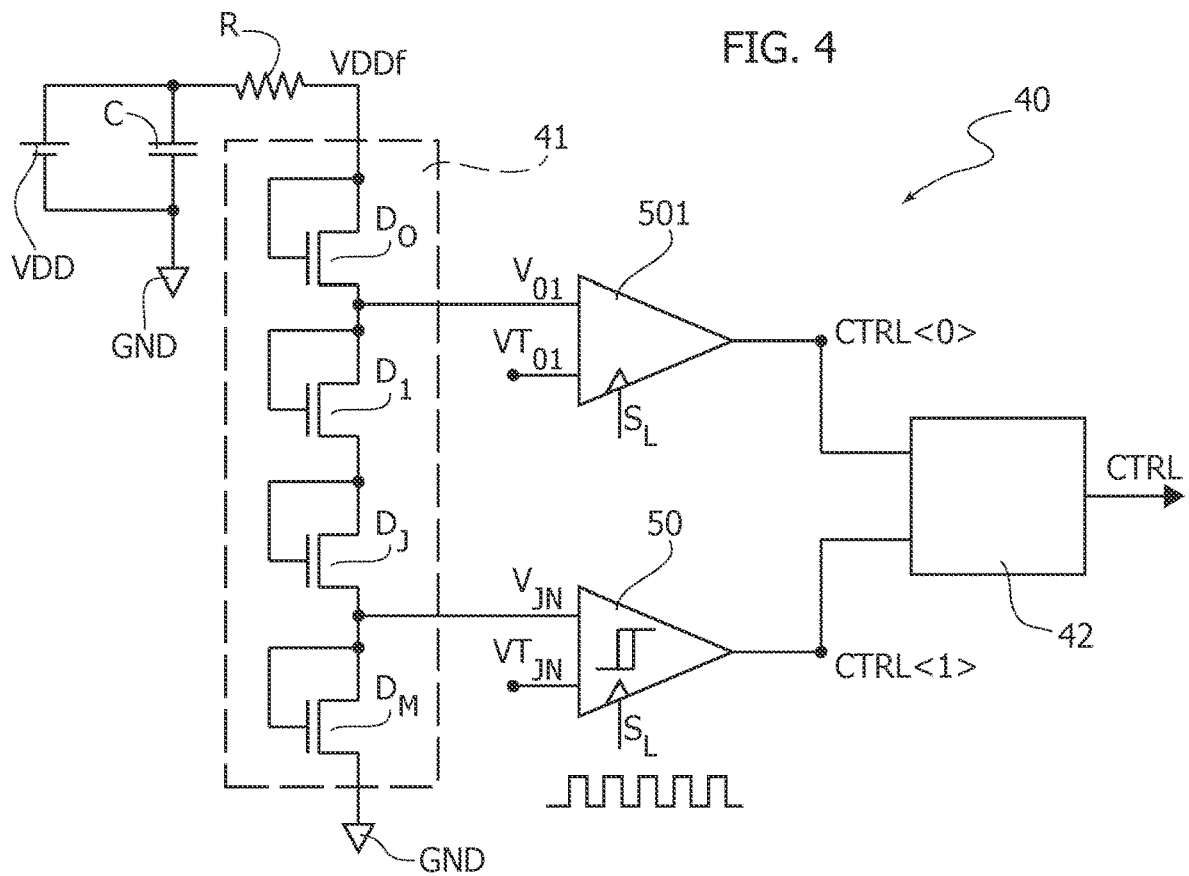
FIG. 4 is a diagram exemplary of a control circuit as per the present disclosure.

As exemplified in FIG. 4, a control circuit 40 configured to provide the control signal CTRL (e.g., to drive the switches $S_1$, $S_j$, $S_N$; $S_{1j}$, $S_{jN}$ or directly to the charge pump stages 101, 10J, 10N in order to adjust an active number thereof) comprises:
- sensing circuitry 41 (e.g., a potential divider 41 comprising a cascade of diode transistors $D_0$, $D_1$, $D_j$, $D_M$ referred to ground) coupled to the supply node VDD of the charge pump 10, 20 to receive the supply voltage VDD therefrom and to provide a set of sensing signals $V_{FB}$ based on the supply voltage VDD (e.g., providing at least one sensing signal $V_{FB}$ as at least one fraction of the supply voltage VDD),
- at least one comparator 50 comprising a first input node $V_{01}$ coupled to the potential divider 41, e.g., to the first $D_1$ or last $D_N$ diode in the diode branch, and configured to receive a sensing signal $V_{01}$, $V_{jN}$ sensed at a node of the divider 41, for instance a first voltage level $V_{01}$ at a diode node of the first diode $D_1$ or a second voltage level $V_{jM}$ at a diode node of the M-th diode $D_N$ referred to ground GND, the hysteresis comparator 50 having a second input node $VT_{01}$, $VT_{jN}$ configured to receive a reference voltage level (e.g., a first reference voltage level $VT_{01}$ or a second reference voltage level $VT_{02}$), the comparator 50 configured to perform a comparison of the sensing signal $V_{01}$, $V_{jN}$ and the reference voltage level $VT_{01}$, $VT_{jN}$ and to assert a digital logic value of a bit CTRL<0>, CTRL<1> (e.g., a first bit CTRL<1> or a second bit CTRL<0>) of the control signal CTRL whose value determines the ON/OFF state of (switches $S_1$, $S_N$ or $S_{1j}$, $S_{jN}$ coupled to the) charge pump stages or modules 101, 10J, 10N.

As exemplified in FIG. 4, an optional RC network circuit R, C is preferably interposed between the input power supply VDD and the potential divider 41, the RC network R, C configured to filter ripples that may be present on the supply voltage VDD output by the power supply generator VDD, e.g., at a frequency of the synchronization signal $S_L$, providing a filtered supply voltage level VDDf to the potential divider 41; for instance, the voltage drop across the resistance R of the RC network is very low thanks to small current flowing in a (adequately dimensioned) diode channel;

As exemplified in FIG. 4, the comparator 50 further comprises a synchronization node $S_L$ configured to receive a synchronization signal $S_L$, the hysteresis comparator 50 configured to perform the comparison between the sensing signal $V_{01}$, $V_{jN}$ with the reference voltage level $VT_{01}$, $VT_{jN}$ and to output the result thereof in tempo with an edge (e.g., rising or falling) of the synchronization signal $S_L$, as discussed in the following.

As visible by comparing exemplary time diagrams of synchronization signals $S_H$, $S_L$ illustrated in FIGS. 3 and 4, the synchronization signal $S_L$ used to temporize the hysteresis comparator 50 has a lower frequency with respect to that of the synchronization signal $S_H$ used to temporize the comparator 32 in the clock generator circuit block 30.

For instance, the frequency of the synchronization signal $S_L$ is adapted to the specification of slope variation of the power supply voltage VDD (e.g., low frequency about 1-2 MHz to filter noise and reduce consumption for slower slope variation over time of supply voltage VDD and higher frequency for faster slope variation over time of supply voltage VDD), while the synchronization signal $S_H$ used to temporize the comparator 32 in the clock generator circuit block 30 has a comparatively higher frequency FH (e.g., about 128 MHz).

As exemplified in FIG. 4, the control circuit 40 comprises a plurality of comparators 50, 501, for instance:
- a first (e.g., hysteresis) comparator 50 comprising a first input node $V_{jN}$ coupled to the N-th diode transistor $D_N$ of the potential divider 41 to receive a first sensing signal $V_{jN}$ therefrom, the first hysteresis comparator 50 having a second input node $VT_{jN}$ configured to receive a first reference voltage level $VT_{jN}$, the first hysteresis comparator 50 configured to perform a comparison of the first sensing signal $V_{jN}$ and the first reference voltage level $VT_{jN}$ and to assert a first bit CTRL<1> of the control signal CTRL whose value determines the ON/OFF state of the (switches $S_1$, $S_j$, $S_N$ or $S_{ij}$, $S_{jN}$ coupled to the) charge pump circuit stages 101, 10J, 10N, and
- a second (e.g., hysteresis) comparator 501 comprising a first input node $V_{01}$ coupled to the first diode transistor $D_1$ to receive a second sensing signal $V_{01}$ therefrom, the second hysteresis comparator 501 having a second input node $VT_{01}$ configured to receive a second reference voltage level $VT_{01}$, the second hysteresis comparator 501 configured to perform a comparison of the second sensing signal $V_{01}$ and the second reference voltage level $VT_{01}$ and to assert a second bit CTRL<0> of the control signal CTRL whose value determines the ON/OFF state of the (second switches $S_1$, $S_j$, $S_N$ or $S_{ij}$, $S_{jN}$ coupled to the) charge pump stages 101, 10J, 10N.

In one or more exemplary cases, the quantity of comparators 50, 501 used in the control circuit 40 is determined independently of the number of charge pump stages 101, 10J, 10N in the device 10, 20.

For instance, it is possible to selectively bypass more than one module 101, 10J, 10N via a same control signal CTRL (e.g., driving more than one switch $S_1$, $S_j$, $S_N$; $S_{1j}$, $S_{1N}$ therewith).

For instance, the number of comparators 50, 501 are selected based on a number of threshold values VT01, VTjN to be detected.

In an exemplary case, for instance, the potential divider of the sensing circuit 41 has a number of diodes N equal to the number of the diodes in the potential divider 31 in the clock generating circuit block 30.

Matching the number of diodes in the sensing circuit 41 with those in the divider 31 of the pump regulator 30 facilitates matching one of the reference threshold values $VT_{01}$, $VT_{jN}$ to the regulated output voltage $V_{OUT}$.

As exemplified in FIGS. 1 to 4, a device 10; 20 comprises:
 a supply node VDD configured to be coupled to a supply voltage source to receive a supply voltage VDD therefrom;
 an output node $V_{OUT}$ configured to provide to a load circuit $C_L$, $Z_L$ an output voltage $V_{OUT}$ based on the supply voltage;
 a plurality of switched stages 101, 10J, 10N coupled to the supply node to receive the supply voltage therefrom and coupled to the output node to provide the output voltage thereto;
 a sensing circuit 41 coupled to the supply node VDD to sense therefrom at least one sensing signal $V_{01}$, $V_{jN}$ based on the supply voltage VDD, and
 a driver circuit 40; 100 coupled to the sensing circuit to receive the at least one sensing signal and coupled to the plurality of switched stages to provide a drive signal CTRL. For instance, the driver circuit is configured to:
 produce 50, 501 the drive signal based on the at least one sensing signal $V_{01}$, $V_{jN}$ exceeding or failing to exceed at least one reference voltage level $VT_{01}$, $VT_{jN}$, and
 selectively bypass a selected number of switched stages in the plurality of switched stages based on the drive signal CTRL, varying the output voltage level $V_{OUT}$ provided to the output node as a result.

As exemplified in FIG. 1 or 2, the device further comprises a plurality of bypass switches $S_1$, $S_j$, $S_N$; $S_{1j}$, $S_{jN}$ coupled to the plurality of switched stages and to the driver circuit. For instance:
 bypass switches in the plurality of bypass switches comprise respective control nodes configured to receive the drive signal and respective current flow paths therethrough configured to be made conductive or non-conductive based on the drive signal;
 current flow paths of bypass switches in said plurality of bypass switches are made conductive, based on said drive signal, to selectively bypass said selected number of switched stages in said plurality of switched stages, and
 the output voltage level provided to the output node varies as a function of said selected number of bypassed switched stages in the plurality of switched stages.

In one or more exemplary cases, comparators 50, 501 in the drive circuit 40 comprises a dynamic comparator 32 as the one discussed in the foregoing (mainly with reference to FIG. 3).

In alternative exemplary cases, comparators 50, 501 in the control circuit 40 comprises a hysteresis comparator as discussed in the following (mainly with reference to FIG. 5). For instance, this facilitates reducing or avoiding continuous switching of the charge pump circuit 10 when the supply voltage VDD has a voltage level VDD close to the threshold voltage level(s) $VT_{01}$, $VT_{jN}$.

Figure 5:
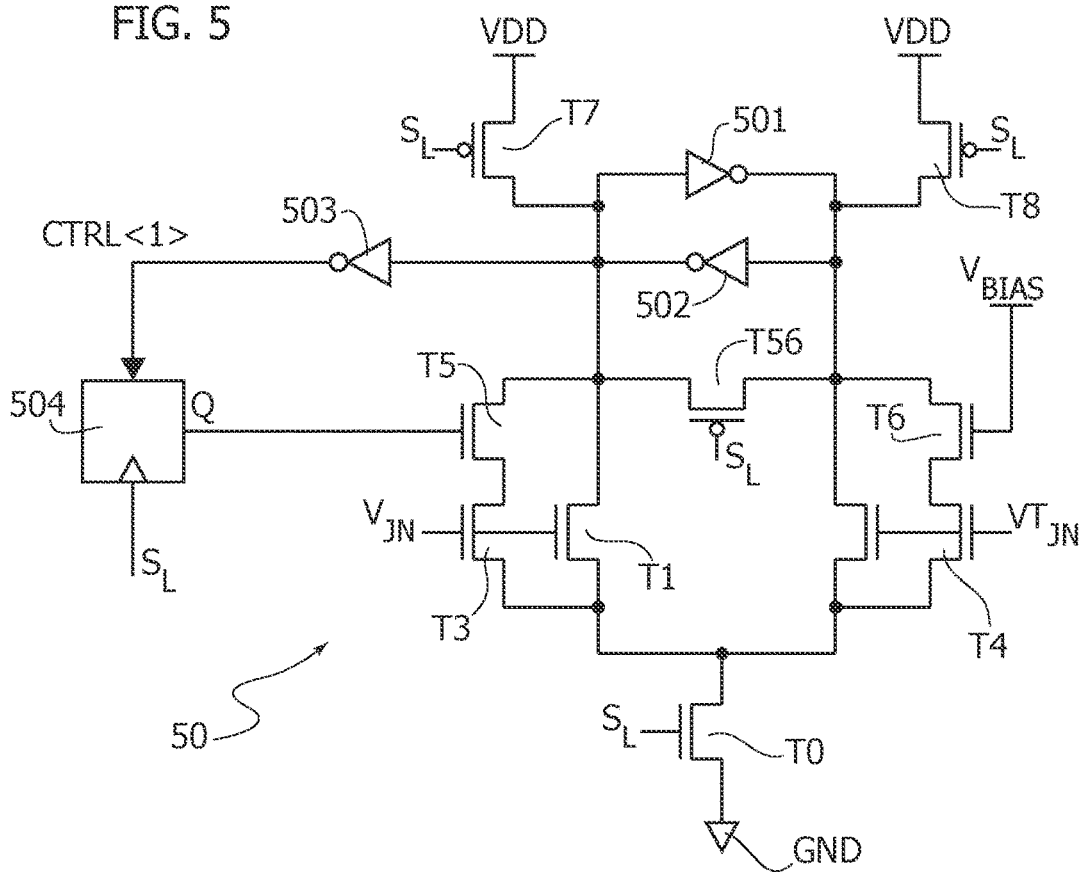
FIG. 5 is a diagram of a comparator circuit as per the present disclosure.

As exemplified in FIG. 5, a hysteresis comparator 50 comprises:
 a first pair of (e.g., matched) transistors T1, T2 comprising a first transistor T1 having a control node configured to receive the (e.g., first $V_{jN}$) sensing signal and a second transistor T2 having a control node configured to receive the (e.g., first $VT_{jN}$) reference voltage level, the first T1 and second T2 transistors having a common (e.g., source) node therebetween coupled to a switched bias current generator T0 controlled via the synchronization signal $S_L$,
 a second pair of transistors T3, T4 comprising a third transistor T3 and a fourth transistor T4, the third transistor T3 having a respective control node coupled to the control node of the first transistor T1, the fourth transistor T4 having a respective control node coupled to the control node of the second transistor T2, the third T3 and fourth T4 transistors having a common (e.g., source) node therebetween and coupled to the common node of the first T1 and second T2 transistors of the first pair of transistors T1, T2,
 a first balancing switch T5 coupled to the first T1 and the third T3 transistors and configured to selectively couple respective transistor nodes therebetween based on a control signal Q received at a respective control node of the first switch T5,
 a second balancing switch T6 coupled to the second T2 and the fourth T4 transistors and configured to couple respective transistor nodes therebetween based on a bias signal $V_{BIAS}$ received at a respective control node of the second switch T6,
 a third switch T56 coupled to the first T5 and second T6 switches and configured to selectively connect respective current paths therethrough in tempo with signal edges of the synchronization signal $S_L$,
 a set of inverter circuits 501, 502, 503, coupled to the first and second pair of transistors T1, T2 and configured to provide the result of the comparison (e.g., CTRL<1>) between the input signals $V_{jN}$, $VT_{jN}$, wherein a first pair 501, 502 of inverters are in opposition therebetween and are configured to provide a latch-comparator, and wherein a third inverter 503 is configured to correct polarity of the comparison signal CTRL<1> signal,
 a pair of coupling switches T7, T8 coupled to the supply node VDD, the pair of biasing switching comprising a first coupling transistor T7 coupled to the first transistor T1 and a second coupling transistor T8 coupled to the second transistor T2, wherein the first T7 and second T8 coupling transistors are configured to be switched ON to preset both side of the comparison signal output to VDD when the synchronization signal $S_L$ has the second logic value (e.g., "0" or ground) as well as to be switched OFF when the synchronization signal $S_L$ has the first logic value (e.g., "1" or VDD) and the comparator 50 is switched on,
 sequential logic circuitry 504 coupled to the set of inverters 501, 502, 503 and to the first switch T5, the sequential logic circuitry 504 configured to receive the comparison signal (e.g., CTRL<1>) and to output, clocked via the synchronization signal $S_L$, a drive signal Q for the first switch T5 of the comparator 50.

As exemplified in FIG. 5, transistors T3 and T4 of the second pair of transistors T3, T4 may be scaled replicas of respective transistors in the first pair of matched transistors T1, T2. For instance, T3 and T4 may be have twice the size of the first transistor T1 with this equal to the second transistor T2.

Figure 6:
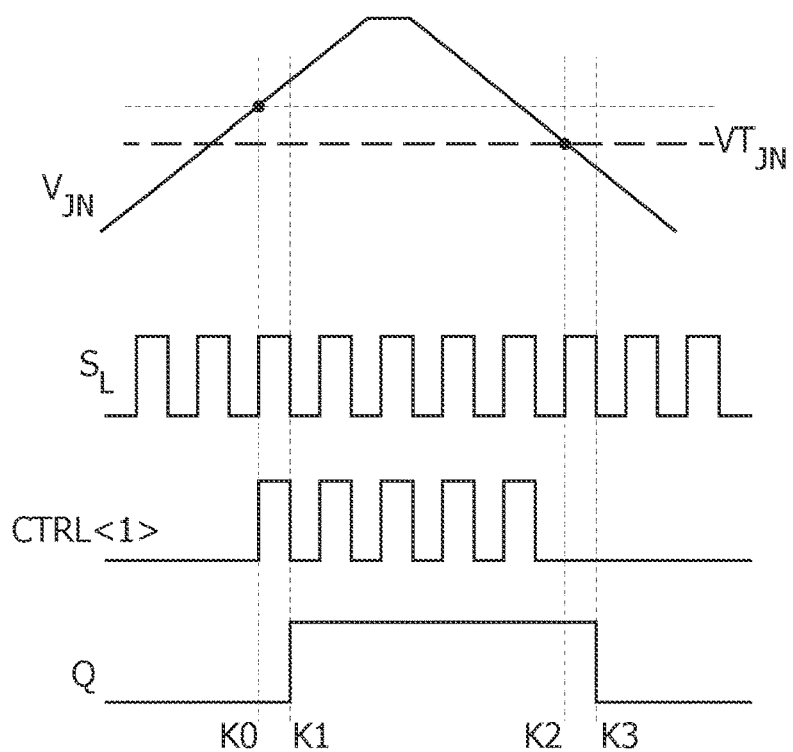
FIG. 6 is a timing diagram of signals that may be used in one or more embodiments.

As exemplified in FIGS. 5 and 6, hysteretic behavior of the hysteresis comparator 50 is a result of dynamically varying a state of the input stage of the comparator 50 in tempo with the synchronization signal $S_L$, whose period determines a duration of each state or phase.

As exemplified in FIG. 6, the drive signal Q has the value of the output signal CTRL<1> in a phase preceding the phase that is being considered.

As exemplified in FIG. 6, for instance:
- at a first time instant K0, corresponding to a first (e.g., rising) edge of the synchronization signal $S_L$, the increasing voltage of the first sensing signal $V_{jN}$ exceeds the second reference voltage level $VT_{jN}$; as a result, the comparator 50 outputs the result of the comparison CTRL<1> with a first (e.g., "1" or "high") logic value; at the same time, as drive signal Q keeps memory of the result of the comparison, it has a second (e.g., "0" or "low") logic value, so that the first balancing switch T5 is turned off (that is, open and non-conductive);
- at a second time instant K1 at a period of the synchronization signal $S_L$ after first time instant K0, the comparison signal CTRL<1> is reset while its logic value is "stored" into Q, whose value is updated and thus becomes equal to the first (e.g., "1" or "high") logic value; the updated value of drive signal Q turns on the first switch so that the first T1, T2 and second T3, T4 pairs of transistors form a balanced differential amplifier that operates as a balanced comparator with threshold value equal to the reference value (e.g., first reference value $VT_{jN}$) input at the control node of the second transistor T2.

As exemplified in FIG. 6, the process does not work with perfect symmetry for the case in which the input signal is decreasing. For instance:
- at a at a third time instant K2, corresponding to the first (e.g., rising) edge of the synchronization signal $S_L$, the decreasing voltage of the first sensing signal $V_{jN}$ equals (that is, fails to exceed) the second reference voltage level $VT_{jN}$; as a result, the comparator 50 outputs the result of the comparison CTRL<1> with a second (e.g., "0" or "low") logic value; at the same time, drive signal Q maintains the first (e.g., "1" or "high") logic value, so that the first balancing switch T5 remains turned on (that is, closed and conductive);
- at a fourth time instant K3 at a period of the synchronization signal $S_L$ after third time instant K2, the comparison signal CTRL<1> is reset while its logic value is "stored" into Q, whose value is updated and thus becomes equal to the second (e.g., "0" or "low") logic value; the updated value of drive signal Q turns off the first switch T5 so that the first T1, T2 and second T3, T4 pairs of transistors form an unbalanced comparator circuit that operates with threshold value equal to the reference value plus an offset Δ due to unbalance of the input stages, e.g., $VT_{jN}$.

As exemplified in FIGS. 5 and 6, the comparator 50 is hysteretic in that the output comparison signal CTRL<1> takes into account not only whether the input sensing signal $V_{jN}$ exceeds or fails to exceed the reference voltage $VT_{jN}$ but also whether it has an increasing or decreasing evolution over time.

As exemplified herein, the at least one sensing signal $V_{01}$, $V_{jN}$ has a time varying slope; the driver circuit is configured to: detect 504 whether the time varying slope of the at least one sensing signal $V_{01}$, $V_{jN}$ increases or decreases over time, and produce 50, 501 the drive signal CTRL based on the at least one sensing signal exceeding or failing to exceed the at least one reference voltage level as well as based on the detected time varying slope of the at least one sensing signal increasing or decreasing over time.

As exemplified in FIG. 4, the sensing circuit 41 comprises an integer number N of sensing circuit stages $D_0$, $D_1$, $D_j$, $D_N$ cascaded in a current flow line between said supply node VDD and ground GND. For instance, the sensing circuit 41 is configured to:
- sense a first sensing signal $V_{jN}$ at a node of a first sensing circuit stage $D_0$ in the sensing circuit stages as a first fraction of the supply voltage VDD, and
- sense a second sensing signal $V_{jN}$ at a node of a N-th sensing circuit stage $D_N$ in the sensing circuit stages as a second fraction of the supply voltage.

As exemplified in FIG. 4, the driver circuit comprises:
- a first comparator 50 configured to produce a first comparison signal CTRL<0> having a first logic value in response to the first sensing signal exceeding a first reference threshold $VT_{jN}$ and a second logic value in response to the first sensing signal failing to exceed the first reference threshold;
- a second comparator 501 configured to produce a second comparison signal CTRL<1> having a first logic value in response to said second sensing signal $V_{01}$ exceeding a second reference threshold $VT_{01}$ and a second logic value in response to the second sensing signal failing to exceed the second reference threshold, and
- combinatorial logic 42 configured to logically combine the first comparison signal CTRL<0> and the second comparison signal CTRL<1>, providing the drive signal CTRL as a result of the logic combination 42.

As exemplified in FIGS. 4 to 6, the driver circuit comprises: a first comparator 50 configured to detect a first time varying slope of the first sensing signal and configured to produce a first comparison signal CTRL<0> having a first logic value in response to the first sensing signal exceeding a first reference threshold $VT_{jN}$ as well as said detect first time varying slope increasing over time, the first comparison signal CTRL<0> having a second logic value in response to the first sensing signal $V_{jN}$ failing to exceed the first reference threshold $VT_{jN}$ as well as the detect first time varying slope decreasing over time; a second comparator 501 configured to detect a second time varying slope of the second sensing signal and configured to produce a second comparison signal CTRL<1> having a first logic value in response to the second sensing signal exceeding a first reference threshold $VT_{01}$ as well as said detected second time varying slope increasing over time, the second comparison signal CTRL<1> having a second logic value in response to the second sensing signal $V_{jN}$ failing to exceed the first reference threshold as well as said detected second time varying slope decreasing over time, and combinatorial logic 42 configured to logically combine the first comparison signal and the second comparison signal, providing the drive signal CTRL as a result of the logic combination thereof.

For instance, the drive signal CTRL is a multi-bit digital signal comprising a least-significant bit equal to the second comparison signal and a most-significant bit equal to the first comparison signal.

As exemplified herein, wherein the device comprises a RC network R, C intermediate the supply node VDD and the sensing circuit 41, the RC network configured to receive the supply voltage level VDD from the supply node and to apply filtering thereto, providing a filtered supply voltage level VDDf to the sensing circuit 41 as a result.

As exemplified in FIG. 4, the control signal CTRL is a digital signal formed by combining (e.g., in a combinatorial circuit block 42) the 1-bit signals CTRL><0>, CTRL<1> output by the hysteresis comparators 50 and used to selectively bypass (e.g., by driving the switches $S_1$, $S_N$ or $S_{ij}$, $S_{jN}$) charge pump stages 101, 10J, 10N of the device 10, 20.

For instance, in an exemplary scenario in which the first reference voltage level $VT_{jN}$ is greater than the second reference voltage level $VT_{01}$, the combinatorial logic 42 can combine the control signal bits CTRL<0>, CTRL<1> so that:

when the (filtered) supply voltage level VDD, VDDf is below the second reference voltage level $VT_{01}$, e.g., VDD<$VT_{01}$, then control signal CTRL=CTRL<1: 0>=00, when the (filtered) supply voltage level VDD, VDDf is below the first reference voltage level $VT_{jN}$ and above the second reference voltage level VT01, e.g., $VT_{01}$<VDD<$VT_{jN}$, then control signal CTRL=CTRL<1:0>=01, when the (filtered) supply voltage level VDD, VDDf is above the first reference voltage level $VT_{jN}$, e.g., VDD>$VT_{jN}$, then control signal CTRL=CTRL<1: 0>=11.

As exemplified in FIGS. 1, 2 and 4, it is possible to selectively activate/deactivate one or more stages 101, 10J, 10N of the charge pump circuit 10 exemplified in FIG. 1 (or the charge pump circuit 20 exemplified in FIG. 2) based on a control signal CTRL obtained with the control circuit 40, 42 exemplified in FIG. 4 and implemented into the control circuit 100 exemplified in FIG. 1 (e.g., providing the drive signal CTRL to switches $S_1$, $S_j$, $S_N$, $S_{1j}$, $S_{jN}$ or directly to the stages 101, 10J, 10N of the device 10, 20).

It is noted that more than two comparators 50 can be used and more than two reference voltage levels $VT_{01}$, $VT_{jN}$ can be selected to perform various finer or coarser methods of adjusting the number N of stages/modules 101, 10J, 10N of the charge pump circuit 10, 20.

For instance, a third comparator may sense a further sensing signal at any point between the diodes D0, D1, Dj, DN of the potential divider 41 in the control circuit 40.

As exemplified in FIGS. 7 to 12, in case the charge pump comprises the "bundle" arrangement 20, the control circuit 100 may be further configured to drive the clock period of clock signals $CK_1$, $CK_j$, $CK_N$ to vary in response to a variation of the input voltage VDD.

Figure 7:
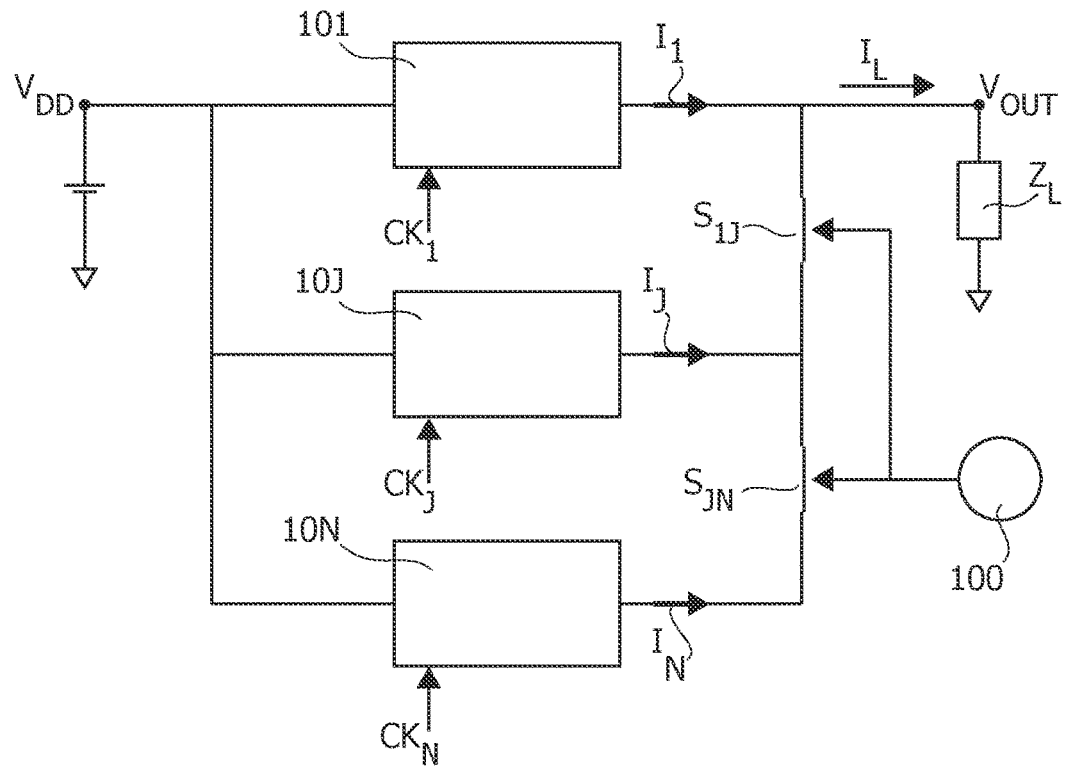
FIGS. 7-12 are diagrams exemplary of principles underlying one or more alternative embodiments as per the present disclosure.

As exemplified in FIG. 7, in the exemplary case of a charge pump 20 comprising three charge pump stages 101, 10J, 10N, in a "worst-case scenario" in which VDD is at a minimum value, the control circuit 100 drives switches S1j, SjN to couple all charge pump stages 101, 10J, 10N in parallel between the input node VDD and the output node $V_{OUT}$. For instance, in such an exemplary scenario the load current $I_L$ flowing in the load $Z_L$ is the sum of current flows $I_1$, $I_2$, $I_3$ provided by each charge pump stage 101, 10J, 10N. For instance, each charge pump stage provides a current that is a fraction of the output current, e.g., $I_1=I_2=I_3=I_L/N$ As exemplified in FIG. 8, in such a configuration the control circuit 100 drives (for instance, at the same time) the state of the switches $S_{1j}$, $S_{jN}$ and the clock signal $CK_1$, $CK_2$, $CK_3$ to have the same period T (e.g., provided by a master clock embedded in the control circuit 100).

Figure 8:
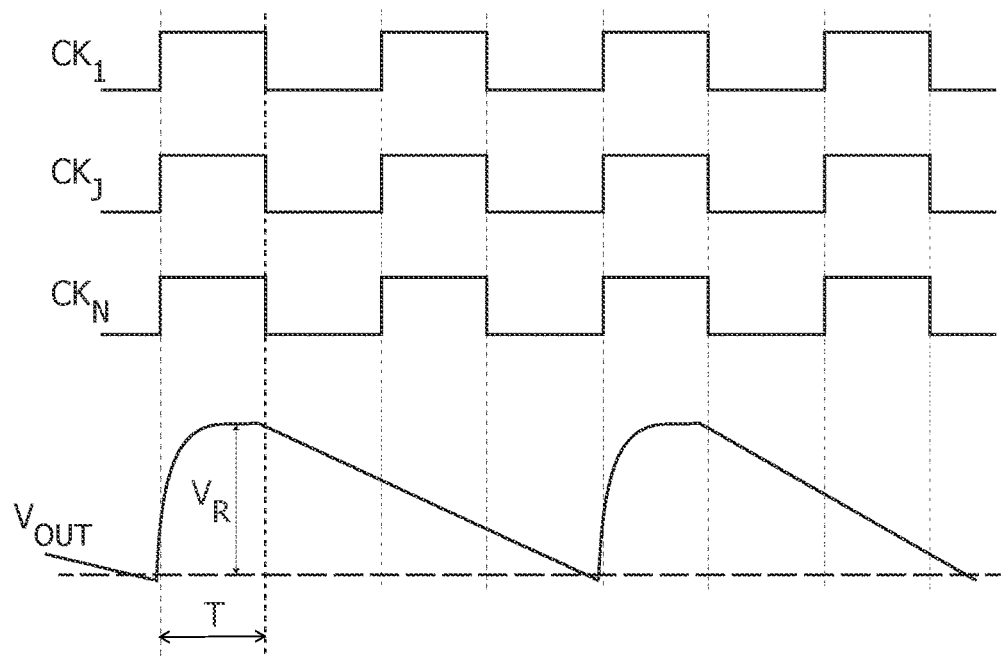

As exemplified in FIG. 8, the output voltage may experience a ripple $V_R$.

Figure 9:
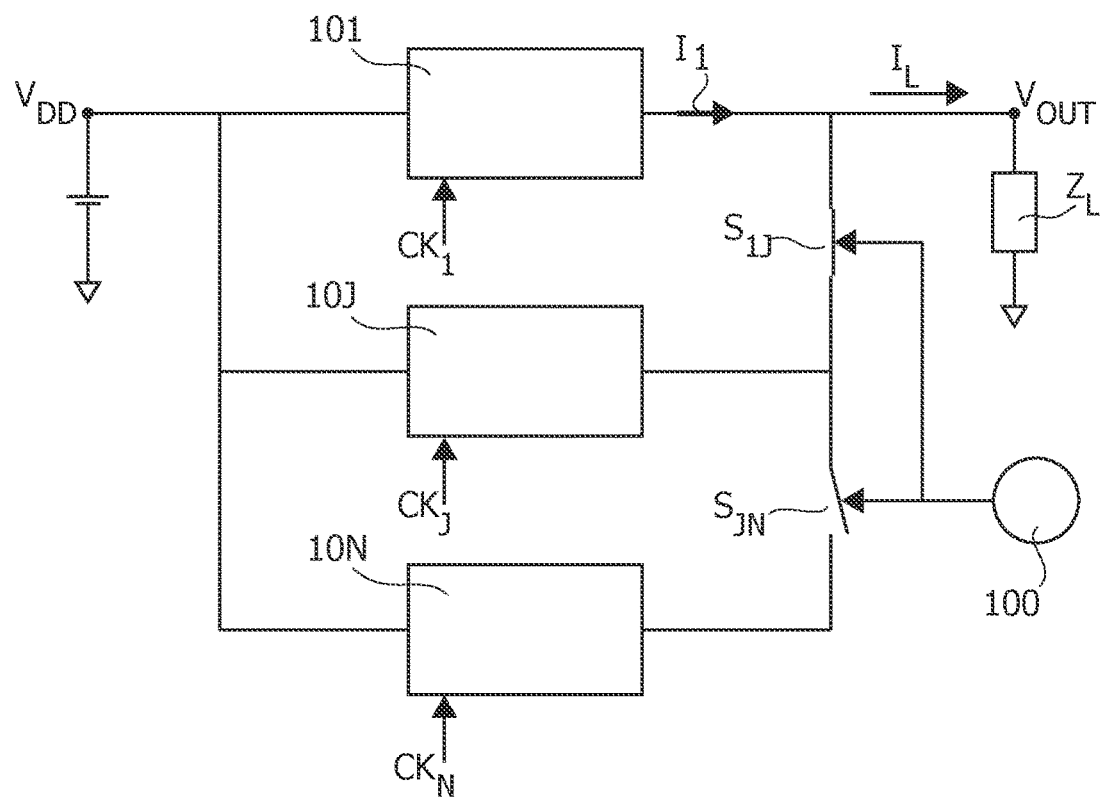
Figure 10:
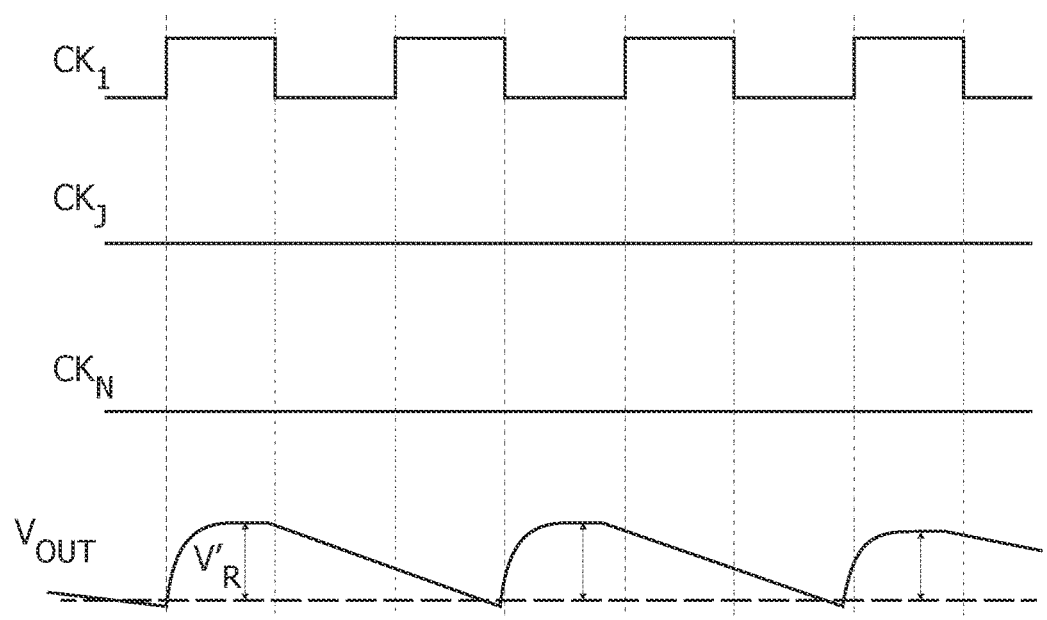

As exemplified in FIGS. 9 and 10, in response to the at least one sensing signal $V_{01}$, $V_{jN}$ exceeding or failing to exceed the at least one reference voltage level $VT_{01}$, $VT_{jN}$, (for instance because the input signal varies from the minimum value to the maximum value, as in a "best" case scenario) the control circuit 100 selectively bypass a selected number of charge pump stages (e.g., two stages 10J, 10N in the considered example) based on the drive signal CTRL, varying the output voltage level $V_{OUT}$ provided to the output node $V_{OUT}$ as a result.

As exemplified in FIG. 10, decoupling the charge pump stages 10J, 10N leads to the reduction of the voltage ripple VR' on the output voltage VOUT, e.g., with respect to the amplitude $V_R$. For instance, the decoupled stages 10J, 10N do not contribute to the output current and hence they are not powered by any clock, while the output current IL is given entirely by the current provided by the first stage $I_1$.

Figure 11:
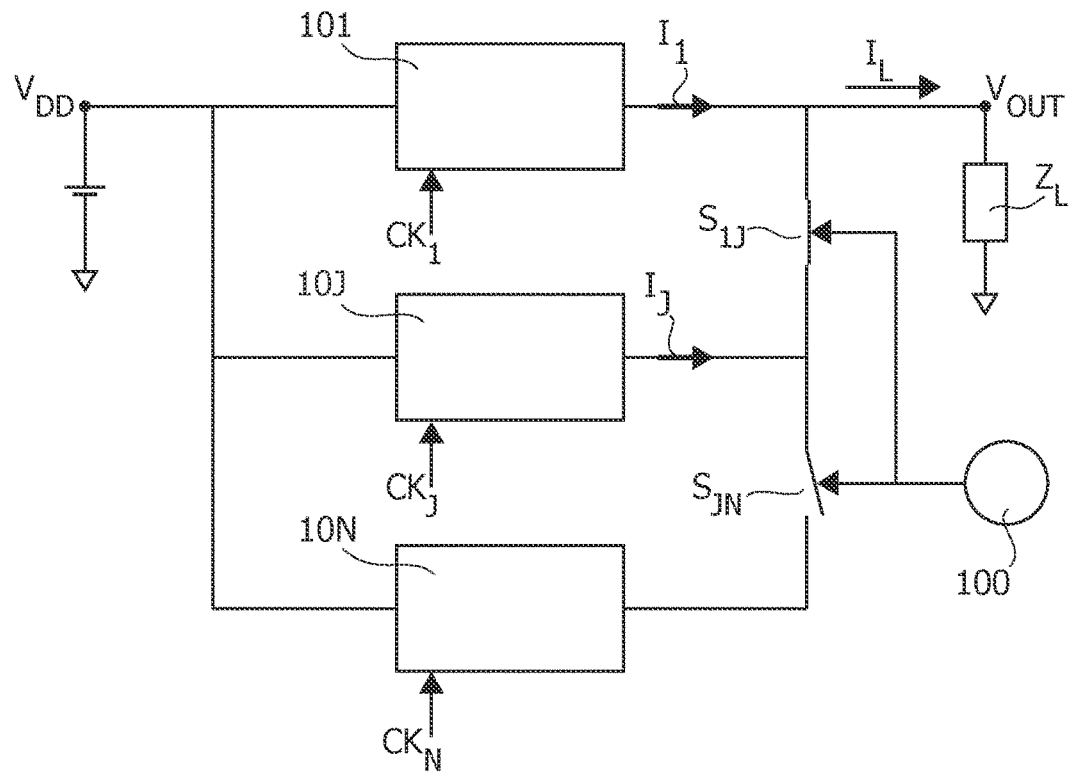

As exemplified in FIG. 11, as an alternative to the exemplary case of FIG. 9, in response to the at least one sensing signal $V_{01}$, $V_{jN}$ exceeding or failing to exceed the at least one reference voltage level $VT_{01}$, $VT_{jN}$, (for instance because the input signal varies from the minimum value to the maximum value, as in a "best" case scenario) the control circuit 100 selectively bypass a selected number of charge pump stages (e.g., last stage 10N in the considered example) and reduces the period of the clock signals $CK_1$, $CK_J$ of the stages 101, 10J that remain coupled based on the drive signal CTRL, varying the output voltage level $V_{OUT}$ provided to the output node $V_{OUT}$ as a result.

Figure 12:
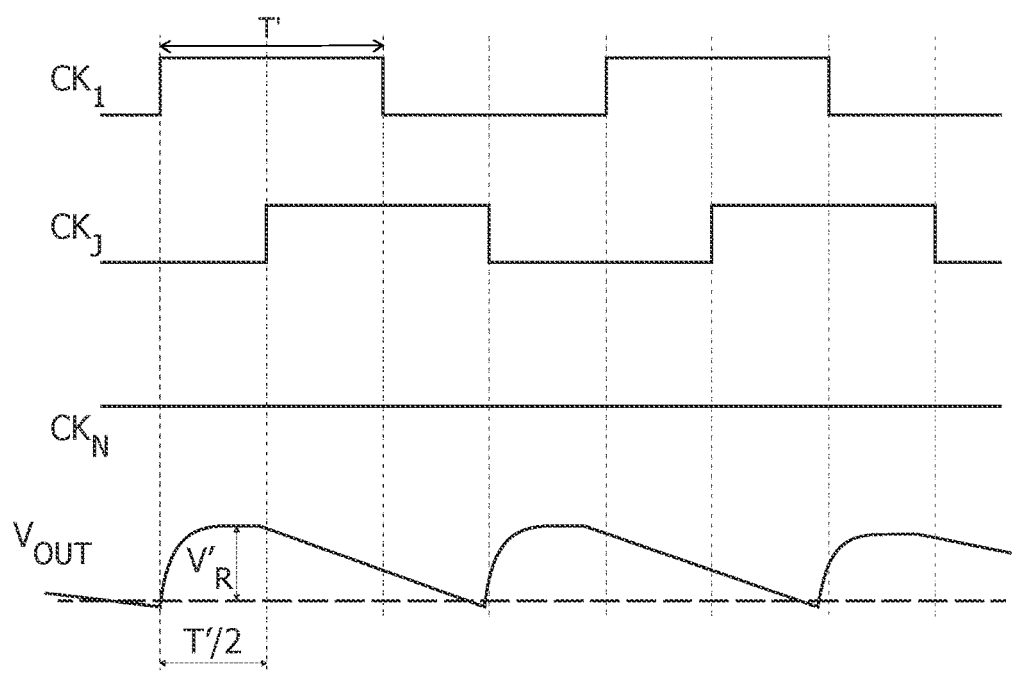

As exemplified in FIG. 12, decoupling the charge pump stages 10N and varying the period T (e.g., obtaining a greater period T' double the initial period T, for instance) of clock signals $CK_1$, $CK_J$, leads to the reduction of the voltage ripple $V_R'$ on the output voltage $V_{OUT}$ that is comparable to the reduction shown in FIG. 11.

As exemplified in FIG. 11, as more stages remain connected to the output node with respect to the solution of FIG. 10, the current provided by each stage 101, 10J may have a lower intensity, e.g., $I_1=I_j=I_L/2<I_L$.

As exemplified herein, switched stages in the plurality of switched stages 101, 10J, 10N are configured to be switched towards a first state in response to a first edge and towards a second state in response to a second edge of respective clock signals $CK_1$, $CK_J$, $CK_N$ having respective clock periods, wherein the driver circuit 40; 100 is configured to, based on said drive signal CTRL:

vary a period of and apply phase shifting to respective clock signals of switched stages in said plurality of switched stages as a function of said selected number of switched stages, varying an output voltage level $V_{OUT}$ (in particular, the voltage ripple $V_R$) provided to the output node of the device as a result.

As exemplified herein, operating a device 20 comprises:
sensing 41 at least one sensing signal $V_{01}$, $V_{jN}$ based on the supply voltage VDD;
producing 50 said drive signal CTRL based on said at least one sensing signal $V_{01}$, $V_{jN}$ exceeding or failing to exceed at least one reference voltage level $VT_{01}$, $VT_{jN}$;

based on the drive signal CTRL:
- selectively bypassing 40; 100 a selected number of switched stages in said plurality of switched stages 101, 10J, 10N, and
- varying a period of the clock signal provided to switched stages in said plurality of switched stages 101, 10J, 10N as a function of said selected number of switched stages (for instance, multiplying the period by the remaining number of stages not selectively bypassed),
- phase shifting clock signals provided to switched stages in said plurality of switched stages 101, 10J, 10N so that they are in antiphase (or in quadrature) therebetween,
- varying an output voltage level $V_{OUT}$ (in particular, the voltage ripple $V_R$) provided to the output node of the device as a result.

For the sake of simplicity, the discussion in the foregoing focuses mainly to devices 10, 20 that use capacitors $C_1$, $C_j$, $C_N$ as energy storage elements (that is, charge pump) in respective stages 101, 10J, 10N. Such a kind of energy storage elements is purely exemplary and in no way limiting. One or more embodiments may apply also to devices using other reactive elements as energy storage elements, such as inductors or a combination of inductors and capacitors.

It will be otherwise understood that the various individual implementing options exemplified throughout the figures accompanying this description are not necessarily intended to be adopted in the same combinations exemplified in the figures. One or more embodiments may thus adopt these (otherwise non-mandatory) options individually and/or in different combinations with respect to the combination exemplified in the accompanying figures.

Without prejudice to the underlying principles, the details and embodiments may vary, even significantly, with respect to what has been described by way of example only, without departing from the extent of protection. The extent of protection is defined by the annexed claims.

What is claimed is:

1. A device comprising:
    a supply node configured to receive a supply voltage;
    an output node configured to provide an output voltage to a load circuit, the output voltage being based on the supply voltage;
    a plurality of switching stages coupled to the supply node and to the output node;
    a sensing circuit coupled to the supply node and configured to provide at least one sensing signal based on the supply voltage; and
    a driver circuit coupled to the sensing circuit and to the plurality of switching stages,
    wherein the driver circuit is configured to receive the at least one sensing signal and to provide a drive signal to the plurality of switching stages, and
    wherein the driver circuit is further configured to:
    provide the drive signal based on the at least one sensing signal exceeding or failing to exceed at least one reference voltage level, and
    selectively bypass a selected number of the plurality of switching stages based on the drive signal thereby varying an output voltage level at the output node.

2. The device according to claim 1, wherein the plurality of switching stages comprises current flow paths cascaded in a current flow line between the supply node and the output node.

3. The device according to claim 1, wherein the plurality of switching stages comprises current flow paths thereby providing current flow lines between the supply node and the output node.

4. The device according to claim 1, further comprising:
    a plurality of bypass switches coupled to the plurality of switching stages and to the driver circuit,
    wherein the plurality of bypass switches comprises respective control nodes configured to receive the drive signal and respective current flow paths therethrough configured to be made conductive or non-conductive based on the drive signal,
    wherein current flow paths of the plurality of bypass switches are made conductive based on the drive signal to selectively bypass the selected number of the plurality of switched stages, and
    wherein the output voltage level provided to the output node varies as a function of the selected number of bypassed the plurality of switched stages.

5. The device according to claim 1, further comprising a plurality of bypass switches coupled to the plurality of switching stages and to the driver circuit.

6. The device according to claim 5, wherein the bypass switches comprise control nodes configured to receive the drive signal and current flow paths, and wherein the bypass switches are configured to make the current flow paths conductive or non-conductive based on the drive signal.

7. The device according to claim 6, wherein the output voltage level varies as a function of the selected number of the plurality of switching stages.

8. The device according to claim 1,
    wherein the at least one sensing signal has a time varying slope, and
    wherein the driver circuit is configured to:
    detect whether the time varying slope of the at least one sensing signal increases or decreases over time, and
    provide the drive signal based on the at least one sensing signal exceeding or failing to exceed the at least one reference voltage level and based on the detected time varying slope of the at least one sensing signal increasing or decreasing over time.

9. The device according to claim 1,
    wherein the sensing circuit comprises an integer number N of sensing circuit stages cascaded in a current flow line between the supply node and ground, and
    wherein the sensing circuit is configured to:
    sense a first sensing signal at a node of a first sensing circuit stage in the sensing circuit stages as a first fraction of the supply voltage, and
    sense a second sensing signal at a node of a N-th sensing circuit stage in the sensing circuit stages as a second fraction of the supply voltage.

10. The device according to claim 9, wherein the driver circuit comprises:
    a first comparator configured to provide a first comparison signal having a first logic value in response to the first sensing signal exceeding a first reference threshold and a second logic value in response to the first sensing signal failing to exceed the first reference threshold,
    a second comparator configured to provide a second comparison signal having a first logic value in response to the second sensing signal exceeding a second reference threshold and a second logic value in response to the second sensing signal failing to exceed the second reference threshold, and
    combinatorial logic configured to logically combine the first comparison signal and the second comparison signal thereby providing the drive signal.

11. The device according to claim 9, wherein the driver circuit comprises:
a first comparator configured to:
detect a first time varying slope of the first sensing signal, and
provide a first comparison signal having a first logic value in response to the first sensing signal exceeding a first reference threshold and the detected first time varying slope increasing over time, the first comparison signal having a second logic value in response to the first sensing signal failing to exceed the first reference threshold and the detected first time varying slope decreasing over time;
a second comparator configured to:
detect a second time varying slope of the second sensing signal, and
provide a second comparison signal having a first logic value in response to the second sensing signal exceeding a first reference threshold and the detected second time varying slope increasing over time, the second comparison signal having a second logic value in response to the second sensing signal failing to exceed the first reference threshold and the detected second time varying slope decreasing over time; and
combinatorial logic configured to logically combine the first comparison signal and the second comparison signal thereby providing the drive signal.

12. The device according to claim 11, wherein the drive signal is a multi-bit digital signal comprising a least-significant bit equal to the second comparison signal and a most-significant bit equal to the first comparison signal.

13. The device according to claim 1, wherein the plurality of switching stages comprises respective switching transistors coupled to respective energy storage elements, and wherein the energy storage elements comprise capacitors having respective capacitances with the same capacitance value.

14. The device according to claim 1, wherein the plurality of switching stages comprises:
a first subset of switching stages comprising switching transistors having control nodes coupled to a first clock node to receive a first clock signal, the switching transistors in the first subset of switching stages configured to make current flow paths therethrough conductive and non-conductive based on a first clock signal received at the control nodes having a first or second logic value; and
a second subset of switching stages comprising switching transistors having control nodes coupled to a second clock node to receive a second clock signal, the switching transistors in the second subset of switching stages being configured to make current flow paths therethrough conductive and non-conductive based on the second clock signal received at respective control nodes having a first or second logic value,
wherein the second clock signal is in antiphase with the first clock signal.

15. The device according to claim 1, wherein the plurality of switching stages are configured to be switching towards a first state in response to a first edge and towards a second state in response to a second edge of respective clock signals having respective clock periods.

16. The device according to claim 15, wherein the driver circuit is further configured to, based on the drive signal, vary a period of and apply phase shifting to respective clock signals of the plurality of switching stages as a function of the selected number of switching stages thereby varying an output voltage level at the output node.

17. A method for operating the device according to claim 1, the method comprising:
sensing the at least one sensing signal based on the supply voltage;
providing the drive signal based on the at least one sensing signal exceeding or failing to exceed the at least one reference voltage level; and
selectively bypassing a selected number of the plurality of switching stages based on the drive signal, thereby varying the output voltage level at the output node.

18. The method according to claim 17,
wherein the at least one sensing signal has a time varying slope, and
wherein the method further comprises:
detecting whether the time varying slope of the at least one sensing signal increases or decreases over time, and
providing the drive signal based on the at least one sensing signal exceeding or failing to exceed the at least one reference voltage level and based on the detected time varying slope of the at least one sensing signal increasing or decreasing over time.

19. A data storage system comprising:
a supply voltage source configured to provide a supply voltage level;
a set of devices, each device being the device according to claim 1,
wherein the set of devices is configured to provide a set of output voltages at a set of output nodes based on the supply voltage level; and
a set of data storage cells coupled to the set of devices and configured to receive the set of output voltages, and
wherein data storage cells in the set of data storage cells are configured to be programmed to store data via the set of received output voltages.

* * * * *